United States Patent [19]

Carris

[11] Patent Number: 4,690,483
[45] Date of Patent: Sep. 1, 1987

[54] TERMINAL BASE ASSEMBLY FOR METER SOCKETS

[75] Inventor: George M. Carris, Monroe, Conn.

[73] Assignee: Westinghouse Electric Corp., Pittsburgh, Pa.

[21] Appl. No.: 913,878

[22] Filed: Sep. 30, 1986

[51] Int. Cl.[4] ............... H01R 9/18; H01R 13/426
[52] U.S. Cl. .................. 439/517; 439/751; 439/839
[58] Field of Search .......... 339/198 M, 198 N, 221 R, 339/221 M, 221 L, 258 F, 259 F, 262 F, 219 R, 219 F, 220 R, 220 A, 220 C, 220 L, 220 J, 252 F, 253 F, 256 C

[56] References Cited

U.S. PATENT DOCUMENTS

| | | | |
|---|---|---|---|
| 2,256,734 | 9/1941 | Cornel et al. | 200/166 |
| 2,325,697 | 8/1943 | Millermaster et al. | 339/253 F |
| 2,647,247 | 7/1953 | Fulton et al. | 339/214 |
| 3,127,228 | 3/1964 | Greco et al. | 339/262 F |
| 3,678,237 | 7/1972 | Rickert et al. | 200/162 |
| 3,714,615 | 1/1973 | Coley | 339/112 |
| 3,731,253 | 5/1973 | Coffey | 339/217 |

Primary Examiner—Gil Weidenfeld
Assistant Examiner—Gary F. Paumen
Attorney, Agent, or Firm—L. P. Johns

[57] ABSTRACT

A terminal base assembly for an electric meter characterized by an insulating base with a jaw terminal for receiving a mating blade terminal of a meter, an electric conductor for conducting current to the jaw terminal, a mounting clip for releasably mounting the jaw terminal in the hole and including offset side walls adjacent to facing walls of the hole and in face-to-face contact with the opposite sides of the jaw terminal, and fastening means securing the jaw terminal, the electric conductor, and the mounting clip together.

8 Claims, 7 Drawing Figures

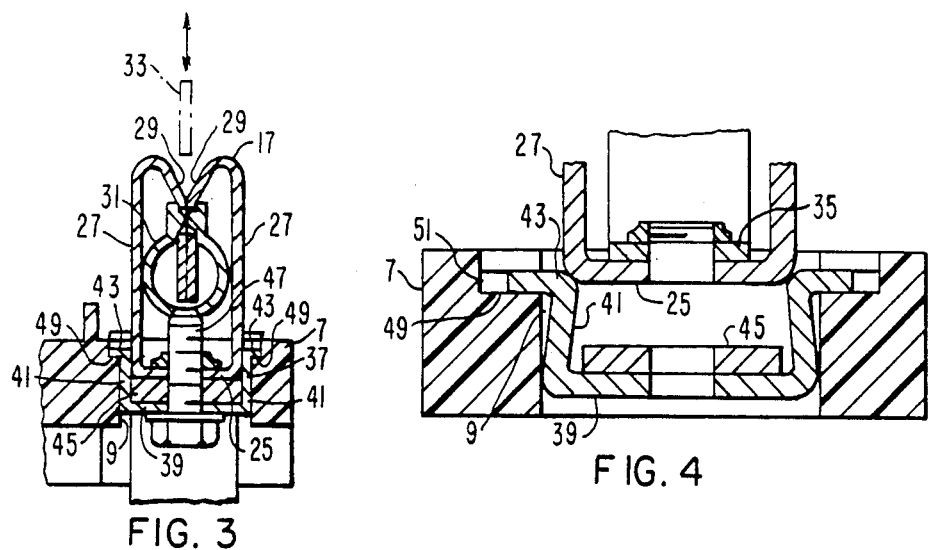
FIG. 3
FIG. 4
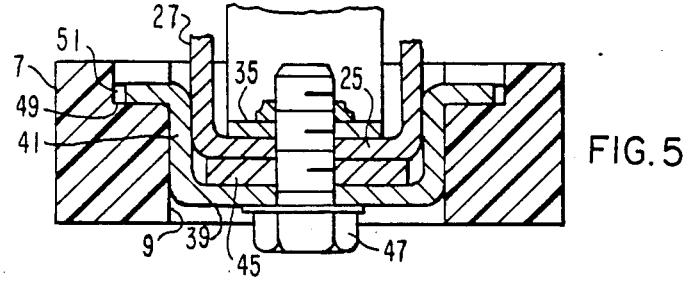
FIG. 5
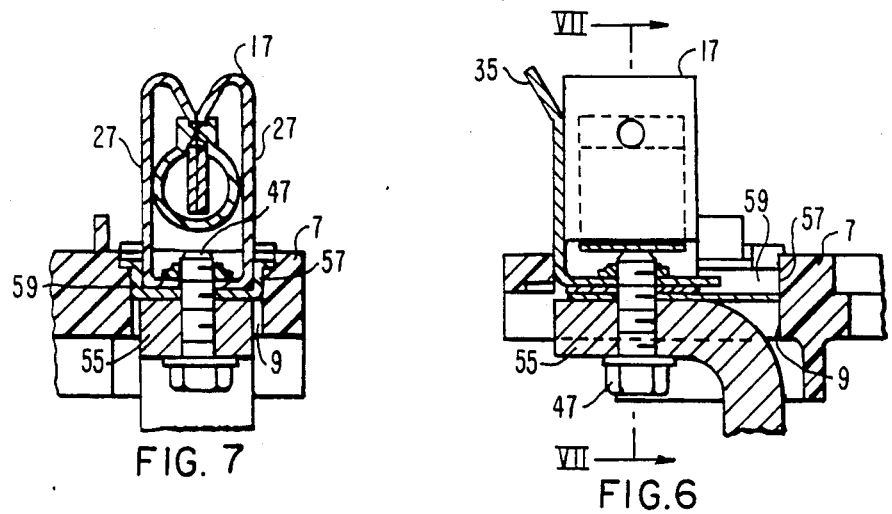
FIG. 7
FIG. 6

TERMINAL BASE ASSEMBLY FOR METER SOCKETS

BACKGROUND OF THE INVENTION

1. Field of the Invention

This invention relates to a terminal base assembly for electric meters and, more particularly, it pertains to an improved means for connecting a meter jaw clip to an insulating base assembly.

2. Description of the Prior Art

Meter sockets normally used for mounting and making electrical connection to electric meters of the watthour type, for example, include an insulating base that supports jaw terminals which mate with blade terminals extending from the meter enclosure. Two pairs of jaw terminals are usually mounted to the mounting base in a fixed relationship with connection to the power line service conductors, or to metered branch circuits of an electrical distribution network at any location.

A detachable watthour meter has terminals of contact blade type extending from the meter. The contact blades are connected to line and load terminals in the form of terminal sockets. Each socket comprises contact jaws for detachably receiving the contact blades of the meter for connection to line and load conductors such as shown in U.S. Pat. No. 3,731,253. In the vernacular, such meter sockets are normally referred to as snap-on terminal assembly for a meter socket.

A disadvantage with some insulating bases for support of jaw terminals has been that mounting screws for the jaw terminals loosen and cause heating of conductors at the meter jaw blade connection because of cycling of a normal load on a watthour meter.

SUMMARY OF THE INVENTION

It has been found in accordance with this invention that a terminal base for a meter socket may be provided which comprises an insulating base including top and bottom sides and having a hole extending between the sides and the hole having facing side walls, a jaw terminal for receiving a mating blade terminal of an electric meter, an electric connector for conducting current to the jaw terminal, a mounting clip for releasably mounting the jaw terminal in the hole and including a flat base with an offset side wall along each opposite edge thereof and with a lateral flange extending from each side wall which side walls are in surface-to-surface contact with the surfaces of the jaw terminals and which flanges are in surface-to-surface contact with the top surface portions adjacent to the hole, the offset side wall of each opposite edge being flared inwardly so as to provide a snug fit of the mounting clip during assembly, each facing side wall including a shoulder on which a lateral flange is disposed, the base including a recess aligned with each shoulder into which the flanges extend, the jaw terminal comprising a substantially U-shaped member having an intermediate surface portion in surface-to-surface contact with the flat base of the mounting clip, the base including at least two holes having aligned axes and thereby retaining preassembled jaw terminals in alignment during final assembly, and fastening means securing the jaw terminal, the electric conductor, and the mounting clip in place in good electrical engagement.

The advantage of the improved jaw clip assembly of this invention is that the insulation material at the connection point in the base assembly is eliminated by providing a unique clip that snaps into the insulating base which enables the various configurations of bus bar to make transition connection to meter jaw clip assembly and the watthour meter assembly.

BRIEF DESCRIPTION OF THE DRAWINGS

FIG. 3 is a sectional view of the insulating base taken on the line III—III of FIG. 1;

FIG. 4 is an expanded partial sectional view of FIG. 3 showing the jaw terminal before being assembled to the mounting clip;

FIG. 5 is an expanded partial sectional view of FIG. 3 showing the completed terminal assembly; and FIGS. 6 and 7 are sectional views of another embodiment of this invention with FIG. 7 being a view taken on the line VII—VII of FIG. 6.

DESCRIPTION OF THE PREFERRED EMBODIMENTS

Figure 1:
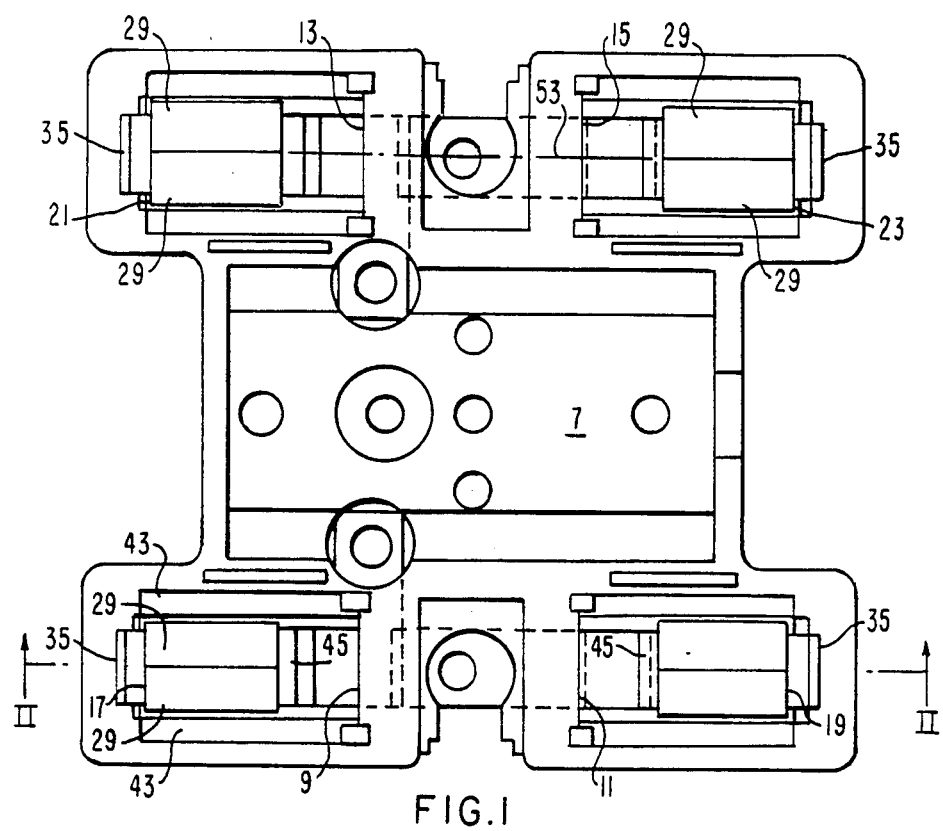
FIG. 1 is a plan view of an insulating base for a meter socket including the snap-on terminal assembly of this invention.
Figure 2:
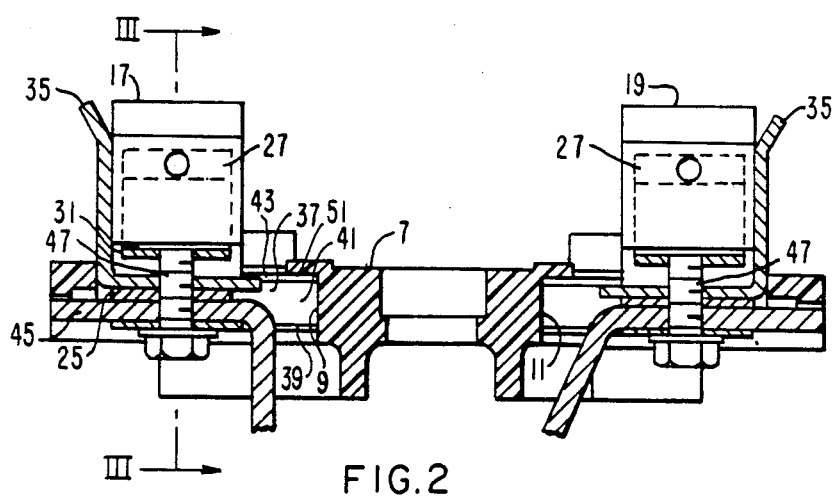
FIG. 2 is a sectional view of the insulating base taken on the line II—II of FIG. 1.

In FIG. 1 an insulating base is generally indicated at 7 and is a thin generally rectangular block of insulating material, such as a polyurethane resin. The insulating base 7 is of a type used in watthour sockets which typically receive a watthour type of integrating electric meter and is well known to those skilled in the art. The base includes two pairs of spaced holes 9, 11 and 13, 15. The holes 9, 11 are rectangular with longitudinal axes aligned. Similarly, the holes 13, 15 are rectangular with longitudinal axes aligned.

First and second pairs of jaw terminals 17, 19 and 21, 23 are fixedly secured in the holes 9, 11, 13, 15, respectively.

Each jaw terminal 17-23 comprises a U-shaped member having an intermediate portion 25 (FIG. 3) and a pair of U-shaped legs 27 having in-turned jaws 29 for receiving a terminal blade of the watthour meter in a conventional manner. A circular spring 31 retains the jaws 29 in positive contact either with themselves (when no blade is present) or in contact with the blade when inserted, such as a blade 33, mounted for lowering into the jaw terminal 17. The jaw also includes a meter blade guide 35 by which a terminal blade 33 is guided into place between the jaws 29.

In accordance with this invention, the terminal jaw assembly includes a mounting clip 37 which is a channel-shaped member having a flat base 39 and a pair of offset side walls 41. Each side wall 41 includes an out-turned lateral flange 43 (FIG. 3).

A conductor 45 extends from the underside of the intermediate portion 25 to connect each jaw terminal 17-23 with the line and load conductors of an electrical service for power distribution subsystem.

The side walls 41 of the clip 37 are preferably tapered inward to hold the jaw terminal in place during assembly and to align corresponding jaws, such as jaws 17 and 19 and jaws 21, 23, with each other on the base, while screws 47 are fixed in place. By this construction, the clip side walls provide additional surface contact with the jaws for added electrical conduction.

The out-turned lateral flanges 43 are seated on ledges 49 for supporting the clip 37 in place.

The manner in which the jaw terminals are assembled in place within the clips is shown more particularly in FIGS. 4 and 5. In FIG. 4, the side walls 41 are shown with an inwardly inclined surface seated within the hole 9 of the insulating base 7. A terminal jaw having U legs is positioned above and upper ends of the side walls 41 (FIG. 4) and pressed downwardly to the position of FIG. 5, causing the side walls 41 to spread against the surface of the hole 9 and moving the out-turned lateral flange 43 into a slot 51 in the base 7. Subsequently, a screw 47 is mounted in place holding the several parts together including the flat base 39, the conductor 45, the intermediate portion 23, and the blade guide 35 together. The guide clip 35 includes a threaded hole 4 holding the screw 47 in place.

Between the time of placement of the U legs 27 into the position shown in FIG. 5, and placement of the screw 47, the assembly is retained in temporary assembly. For that purpose the jaws 29 (FIG. 1) are placed in alignment as indicated by the line 53. Moreover, the electrical conductivity between the U leg 27 and the side wall 41 is enhanced by the snug fit between the interfaces thereof.

Another embodiment of the invention is shown in FIGS. 6 and 7 in which similar numerals refer to similar parts of the embodiments. The embodiment of FIGS. 6 and 7 differ in that where it is necessary to provide heavier bus bars for carrying greater loads, a bus bar or conductor 55 is provided in the same base 7 and with the same jaw terminal 17. The difference between the two embodiments is that the clips have different dimensions. More particularly, the clip 57 (FIGS. 6 and 7) includes side walls 59 of lesser depth than the depth of the walls 41 (FIG. 3). For that reason, the embodiment of FIGS. 6 and 7 provides for location of the conductor 55 outside of and below the clip 57 (instead of within the clip 41 as shown in FIG. 3). For the embodiment of FIGS. 6 and 7, the clip 57 is shallower with shorter side walls 59, but the side walls are tapered to adhere to the jaw assembly in a manner similar to that of FIG. 5. It is pointed out that both clips 37, 57 include tapered side walls to grip the jaws and hold the assembly in a preassembled condition for alignment before final assembly of the screws 47.

In conclusion, the meter jaw clip assembly for connecting to an insulating base for a watthour meter provides the use of a unique clip that snaps into the insulating base allowing for various configurations of bus bars to make the transition connection to the meter jaw clip assembly and the watthour meter assembly. Moreover, the clip eliminates the use of insulating material from the connection point and eliminates field problems that occur in their assemblies of prior construction. Finally, the assembly assures a more positive alignment of the meter jaw clip assemblies from rotation.

What is claimed is:

1. A terminal base for a meter socket, comprising:
   an insulating base including top and bottom sides and including a hole extending between the sides and the hole having facing side walls;
   a jaw terminal for receiving a mating blade terminal of an electric meter;
   an electric conductor for conducting current to the jaw terminal;
   a mounting clip for releasably and frictionally mounting the jaw terminal in the hole and including a flat base with an offset perpendicular side wall along each opposite edge thereof and with a lateral flange extending from each side wall parallel to said flat base, said side walls being in surface-to-surface contact with the jaw terminal and the hole side walls and which flanges are in surface-to-surface contact with top surface portions of said base adjacent to the hole; and
   fastening means securing the jaw terminal, the electric conductor, and the mounting clip in place in good electrical engagement.

2. The terminal base of claim 1 in which the offset side wall of each opposite edge is flared inwardly so as to provide a snug fit of the mounting clip during assembly.

3. The terminal base of claim 1 in which each facing side wall includes a shoulder on which a lateral flange is disposed.

4. The terminal base of claim 3 in which the base includes a recess aligned with each shoulder into which the flanges extend.

5. The terminal base of claim 4 in which the jaw terminal comprises a substantially U-shaped member having an intermediate surface portion in surface-to-surface contact with the flat base of the mounting clip.

6. The terminal base of claim 2 in which the base includes at least two holes having aligned axes and thereby retain preassembled jaw terminals in alignment during final assembly.

7. A terminal assembly for a meter socket, comprising:
   a jaw terminal for receiving a mating blade terminal for an electric meter;
   an electrical conductor for conducting current to the jaw terminal;
   a mounting clip for releasably and frictionally attaching the assembly to an insulating base of a meter socket, the clip having a flat base with an offset perpendicular side wall extending along opposite edges of said flat base and with a lateral flange extending from each side wall parallel to said flat base and the clip being receivable by a hole in said insulating base with the side walls and flanges adapted to be in snug engagement with the surfaces forming the hole and a top surface portion of said insulating base, respectively, and said perpendicular side walls being in frictional engagement with perpendicular side walls of said jaw terminal.

8. The terminal assembly of claim 6 in which the jaw terminal comprises a U-shaped member having U-legs and the side walls of the clip snugly fitting the U-shaped member so as to retain the jaw terminal and clip together.

* * * * *